(12) United States Patent
Nakazawa et al.

(10) Patent No.: US 6,448,665 B1
(45) Date of Patent: *Sep. 10, 2002

(54) SEMICONDUCTOR PACKAGE AND MANUFACTURING METHOD THEREOF

(75) Inventors: Takahito Nakazawa; Yoshiaki Sugizaki, both of Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/172,038

(22) Filed: Oct. 14, 1998

(30) Foreign Application Priority Data

Oct. 15, 1997 (JP) ................................ 9-299404

(51) Int. Cl.$^7$ ................................ H01L 23/48
(52) U.S. Cl. ............ 257/789; 257/787; 257/788; 257/790; 257/795; 257/737; 257/778
(58) Field of Search .................. 257/787–796

(56) References Cited

U.S. PATENT DOCUMENTS

| 4,856,577 | A | * | 8/1989 | Katsu et al. ............... 165/8 |
| 4,965,660 | A | * | 10/1990 | Ogihara et al. ............ 357/81 |
| 5,450,283 | A | * | 9/1995 | Lin et al. ................. 257/787 |
| 5,723,369 | A | * | 3/1998 | Barber .................... 438/106 |
| 5,814,882 | A | * | 9/1998 | Shimada et al. ........... 257/704 |
| 5,847,467 | A | * | 12/1998 | Wills et al. .............. 257/789 |
| 5,864,178 | A | * | 1/1999 | Yamada et al. ........... 257/737 |
| 5,874,784 | A | * | 2/1999 | Aoki et al. .............. 257/787 |
| 5,900,676 | A | * | 5/1999 | Kweon et al. ........... 257/787 |
| 5,969,426 | A | * | 10/1999 | Baba et al. ............. 257/778 |
| 5,998,861 | A | * | 12/1999 | Hiruta .................. 257/700 |

FOREIGN PATENT DOCUMENTS

| JP | 08-279571 | 10/1996 |
| JP | 08-316361 | 11/1996 |
| JP | 9-64080 | 3/1997 |
| JP | 09-069586 | 3/1997 |
| JP | 9-260436 | 10/1997 |

* cited by examiner

Primary Examiner—Tom Thomas
Assistant Examiner—Ori Nadav
(74) Attorney, Agent, or Firm—Finnegan, Henderson, Farabow, Garrett & Dunner, L.L.P.

(57) ABSTRACT

In order to suppress the warp of a semiconductor package of an over-coat structure, when thermal expansion coefficient, Young's modulus and thickness of the wiring substrate are $\alpha s$, $Es$ and $Hs$, respectively, and thermal expansion coefficient, Young's modulus and thickness of the resin layer are $\alpha r$, $Er$ and $Hr$, respectively, the value R of $(\alpha r \cdot Er \cdot Hr)/(\alpha s \cdot Es \cdot Hs)$ is set to be approximately 0.6 or more. With adoption of such a configuration, stress exerting on a semiconductor package can be effectively alleviated, and coplanarity of the semiconductor package can be improved.

15 Claims, 15 Drawing Sheets

FIG. 7

| Hs | Hr | $\alpha r$ [ppm/K] | Er | $\dfrac{\alpha r Er}{\alpha s Es}$ | $\dfrac{\alpha r Er Hr}{\alpha s Es Hs} = R$ | Smax [μm] |
|---|---|---|---|---|---|---|
| 1.0 | 0.2 | 14.6 | 13 | 0.58 | 0.12 | <40 |
| 1.0 | 0.2 | 24.6 | 13 | 0.98 | 0.20 | <40 |
| 1.0 | 0.2 | 39.6 | 13 | 1.58 | 0.32 | <40 |
| 0.4 | 0.2 | 14.6 | 13 | 0.58 | 0.29 | <40 |
| 0.4 | 0.2 | 24.6 | 13 | 0.98 | 0.49 | <40 |
| 0.4 | 0.2 | 27.0 | 13 | 1.08 | 0.54 | <40 |
| 0.4 | 0.2 | 39.6 | 13 | 1.58 | 0.79 | >40 |
| 0.4 | 0.2 | 32.0 | 13 | 1.27 | 0.64 | >40 |
| 0.4 | 0.2 | 100 | 13 | 3.98 | 1.99 | >40 |
| 0.4 | 0.2 | 130 | 13 | 5.18 | 2.59 | >40 |
| 0.4 | 0.2 | 39.6 | 13 | 1.58 | 1.58 | >40 |
| 0.2 | 0.4 | 24.6 | 13 | 0.98 | 0.98 | >40 |
| 0.2 | 0.4 | 24.6 | 13 | 0.98 | 1.96 | >40 |
| 0.2 | 0.4 | 39.6 | 13 | 1.58 | 3.15 | >40 |
| 0.2 | 0.4 | 14.6 | 13 | 0.58 | 1.16 | >40 |

SEMICONDUCTOR PACKAGE AND MANUFACTURING METHOD THEREOF

BACKGROUND OF THE INVENTION

1. Field of the Invention

The present invention relates to semiconductor devices such as semiconductor packages, particularly relates to thin and highly reliable semiconductor packages.

2. Description of the Related Art

As electronic instruments become compact, development of a technology packaging various kinds of electronic components in high density into electronic instruments is being in progress. Further, upon packaging the electronic components with high density, the electronic components such as semiconductor packages and the like are desired to be made smaller and thinner. This is because, in order to realize a compact and highly functional electronic instrument, not only improvement of integration of a semiconductor element but also compactness of a semiconductor package in which a semiconductor element is packaged are required. In order to correspond to such a requirement, various types of thin semiconductor packages are being proposed.

A means for mounting a semiconductor element on a wiring substrate can be generally divided into a face-up type bonding (wire bonding), and face-down type bonding (flip chip bonding).

In the face-up type mounting, connecting electrodes of a semiconductor element and connecting electrodes of a wiring substrate are connected with bonding wires. Then, by molding the semiconductor element including the bonding wires on the wiring substrate, a semiconductor package is formed.

On the other hand, in the face-down type mounting, connecting electrodes of a semiconductor element and connecting electrodes of a wiring substrate are connected with conductive bumps and the like.

In the semiconductor package of the flip chip type, there are an over-coat type in which a semiconductor element is molded as a whole, and a bare chip type in which a semiconductor element is exposed. Even in the latter case, it is generally done to seal a gap between a semiconductor element and a wiring substrate with a resin and the like. Semiconductor packages of the flip chip type, because they can be made thinner than those of the face-up type, are recently used much in CSP(Chip Size Package) and the like. The CSPs are used much in, for instance, computers, semiconductor packages of high frequency and integrated function used in communication instruments, or portable information instruments such as a PDA.

FIG. 11 is a diagram showing a structure of a conventional semiconductor package.

In the semiconductor package 90 illustrated in FIG. 11, a semiconductor element (chip) 92 is mounted in a face-down manner on a wiring substrate 91. Connecting terminals 92a of the semiconductor element 92 and pads 93 disposed on the wiring substrate 91 are connected with conductive bumps 94. The conductive bumps are composed of, for instance, solder, gold and the like.

Further, a gap between the wiring substrate 91 and the semiconductor element 92 is sealed with a resin layer 95 called an under-fill. Here, a semiconductor package of a structure in which a rear surface of the semiconductor 92 is exposed is illustrated, however, if the semiconductor element 92 is covered with a molding resin as a whole, a semiconductor package of the over-coat structure can be obtained.

Further, on the rear surface of the semiconductor mounting surface of the wiring substrate 91, connecting pads 96 connected to the bonding pads 93 are disposed, on the connecting pads 96 solder balls 97 are disposed. Those solder balls 97 and the conductive bumps 94 are connected electrically with interior wiring.

In the wiring substrate 91, glass fabric based epoxy resin is employed as an insulating layer. As the wiring substrate 91, that of two-layered structure is employed here, however, that of multi-layered structure such as three-layered structure or more may be employed. Further, on the rear surface (upper surface) of the semiconductor chip, a metallic cap or a heat-sink is disposed in some cases.

Further, the solder balls are disposed as BGA (ball grid array) type terminals. Incidentally, the connecting terminals 96 to which the solder balls 97 are disposed and the bonding pads 93 of the wiring substrate are connected between layers with, for instance, through holes, conductive pillars consisting of conductive resin and the like.

FIG. 12A, FIG. 12B and FIG. 12C are diagrams explaining a method forming a resin layer 95 (under-fill).

First, on the circumference of a semiconductor element 92, a liquid resin 95i such as epoxy resin or the like is supplied from a dispense nozzle 99. Viscosity of the resin is selected and adjusted according to demands. The dispense nozzle 99 is attached to a syringe in which the resin 95i is stocked. The resin 95i permeates into a gap between the wiring substrate 91 and the semiconductor element 92 due to capillary action (FIG. 12A). That is, the resin 95i supplied from the dispense nozzle 99 is dripped on the circumference of the wiring substrate 91 (FIG. 12B), then the dripped resin permeates into the gap between the wiring substrate 91 and the semiconductor element 92 (FIG. 12C), thus the under-fill is formed thereby.

However, such a thin semiconductor package as described above has a problem described in the following. That is, in order to reduce thickness of a semiconductor package as a whole, strength is sacrificed, accordingly the semiconductor package is liable to suffer deformation such as warp and the like.

When such a warp of the semiconductor package occurs, the connecting terminals 96 and the solder balls 97 constituting the BGA, for instance, are not arranged on the same plane, to deteriorate so-called coplanarity. Therefore, there occur such problems that a semiconductor package is made impossible to be packaged on a mother board, or, even after packaging, in the course of time, due to the added thermal load and the like, reliability of connection can not be maintained. Therefore, in the case of a thin semiconductor package being used actually, how to improve productivity and reliability is a problem to be solved.

In the manufacturing steps of a semiconductor package of flip-chip type such as aforementioned, in the step of forming a resin layer 95, the liquid resin is cured thermally in the temperature range of 100 to 180° C. Therefore, in the course of returning to room temperature, the semiconductor package suffers warp.

Thermal expansion coefficient of a semiconductor element and that of a wiring substrate differ approximately one digit in general. The thermal expansion coefficient of a semiconductor element (chip) consisting of silicon, for instance, is about 3–4 ppm/K, whereas the thermal expansion coefficient of a wiring substrate having an organic insulating layer such as FR-4, FR-5 or BT resin (Bis maleimide triazine) is about 12 to 20 ppm/K. Therefore, deformation due to thermal load is larger for the wiring substrate than that of the semiconductor chip. Therefore, stress pulling the semiconductor element 92 occurs, due to this stress, the semiconductor package suffers warp.

FIG. 13A, FIG. 13B and FIG. 13C are diagrams explaining stress suffered by a semiconductor package. Here, appearance of chip crack and resin crack observed in TCT (Thermal Cycle Test) which is a generally adopted environment test of semiconductor package is shown schematically.

In this test, a so-called fan-in type semiconductor package, in which a wiring substrate 91 is smaller than a semiconductor element 92, was employed.

On a wiring substrate 91 is mounted a semiconductor element 92, a resin layer 95 is filled in a gap formed between the wiring substrate 91 and the semiconductor element. In general, compared with thicknesses of the wiring substrate 91 and semiconductor element 92, that of an under-fill resin layer 95 is extremely thin.

When the aforementioned thermal load is added on such a semiconductor package, on the rear surface side of the semiconductor element 92 a tensile stress works, due to this stress chip crack occurs (FIG. 13A, FIG. 13B).

Further, even in the case of stiffness of the chip enduring the stress, due to the stress working in a direction to peel a semiconductor element and a wiring substrate, fillet crack occurs (FIG. 13C). Thus, in any cases, due to bimetal structure, warp occurs.

Displacement of warp of a semiconductor package after an under-fill is formed is desirable to be suppressed at 100 $\mu$m or less at most, preferable to be 80 $\mu$m or less. Further, the displacement of the warp of the semiconductor package is further desirable to be suppressed approximately 50 to 70 $\mu$m or less. That is implemented so that there does not occur any inconvenience when solder balls 97 or caps are attached after the under-fill is formed, or package coplanarity guaranty (ordinarily the maximum of 100 $\mu$m) is to be satisfied.

For instance, according to the result of simulation of the displacement of the warp caused when a semiconductor element of 20 mm square is mounted on a multi-layered wiring substrate on which a BT of a thickness of 0.8 mm is employed as an insulating layer, approximately 89 $\mu$m of displacement of warp is for a chip of a thickness of 0.3 mm, approximately 77 $\mu$m for a chip of a thickness of 0.45 mm, and approximately 62 $\mu$m for a chip of a thickness of 0.625 mm.

The above described calculation of the coplanarity of the semiconductor package was carried out under the following conditions.

Thermal expansion coefficient of the semiconductor element $\alpha c$: 3.5[ppm/K],
  modulus of elasticity of the semiconductor element: 166 [GPa],
  thermal expansion coefficient of resin layer (under-fill): 26[ppm/K],
  modulus of elasticity of the resin layer (under-fill): 10[GPa},
  thermal expansion coefficient of the wiring substrate: 14.6[ppm/K],
  modulus of elasticity of the substrate: 24[GPa], and temperature difference between cure temperature (150° C.) and room temperature (25° C.): 125° C.

First, radius of curvature $\rho$ is calculated as follows.

FIG. 15 is a diagram for explaining flexure of a multi-layer composite beam.
  Here,
  t is a coordinate between t(i+1) and t(i) and corresponds to a displacement in the direction of the thickness of the semiconductor package.

Here,
  t1: front surface of resin layer of overcoat(t1=0),
  t2: a boundary between the resin layer of the overcoat and the semiconductor element,
  t3: a boundary between the semiconductor element and the resin layer of the under-fill,
  t4: a boundary between the resin layer of the under-fill and the wiring substrate,
  t5: bottom surface of the wiring substrate.
Further,
  $\alpha i$: thermal expansion coefficient of the layer i,
  Ei: modulus of elasticity of the layer i,
  $\sigma i$: thermal stress thereto the layer i is subjected,
  $\epsilon i$: thermal strain (displacement) of the layer i,
  $(t-\delta)/\rho$: distortion (displacement) due to flexure of the i-th layer,
  $\delta i$: coordinate of a neutral line,
  $\rho$: radius of curvature.

Here, $\sigma i$ and $\epsilon i$ can be expressed with the following equations.

$$\sigma i=[\epsilon i+(t-\delta)/\rho]Ei$$

$$\epsilon i=[\Sigma E_j(t_{j+1}-t_j)\,(\alpha_j-\alpha_i)\Delta T]/\Sigma E_j(t_{j+1}-t_j)$$

The neutral line $\delta$ and the radius of curvature $\rho$ are expressed, respectively, by $$\delta=T/S,\ \rho=U/S.$$

Therefore, $$S=-6[\Sigma E_j\epsilon_j(t_{j+1}-t_j)\cdot\Sigma E_j(t_{j+1}^2-t_j^2)-\Sigma E_j\epsilon_j(t_{j+1}^2-t_j^2)\cdot\Sigma E_j(t_{j+1}-t_j)],$$

$$T=-4\Sigma E_j\epsilon_j(t_{j+1}-t_j)\cdot\Sigma E_j(t_{j+1}^3-t_j^3)+3\Sigma E_j\epsilon_j(t_{j+1}^2-t_j^2)\cdot\Sigma E_j(t_{j+1}^2-t_j^2),$$

and $$U=3[\Sigma E_j(t_{j+1}^2-t_j^2)]^2-4\Sigma E_j(t_{j+1}^3-t_j^3)\cdot\Sigma E_j(t_{j+1}-t_j).$$

From the above, the coplanarity of a semiconductor package becomes
  $\rho-\rho\cos(L/\rho/2)$(L is the length of one side of semiconductor package).

When considered dimensional tolerance, approximately 20 $\mu$m of allowance is necessary. Therefore, a chip of a standard size of flip-chip (thickness: 0.3 to 0.625 mm) becomes too large in its warp to be capable of securing sufficient accuracy.

Thus, due to discrepancy of the thermal expansion coefficients of constituent elements of a semiconductor package, there occur problems such as destruction and peeling of the semiconductor element, destruction and peeling of the under-fill, or lowering of coplanarity of the semiconductor package. Such problems are becoming problematic as a semiconductor package becomes thinner.

Another problem of the flip-chip type semiconductor package is in its difficulty of securing heat releasing path for a semiconductor element. In the case of a semiconductor element being mounted on a wiring substrate in a face-up way, a rear surface of the semiconductor element (the surface opposite to the surface where integrated circuit is formed) is connected onto die pads of the wiring substrate. Therefore, heat from the semiconductor element can be released to the wiring substrate side.

Whereas, in the case of a semiconductor package of the flip-chip type, heat generated by the semiconductor can not be released easily towards the wiring substrate side. This is because connection between the semiconductor element and the wiring substrate is implemented with fine conductive bumps, and because resin of small thermal conductivity is filled in the gap between the semiconductor element and the wiring substrate.

Therefore, in a semiconductor package of flip-chip type suitable for high density packaging, a technology enabling enhancement of heat release efficiency of a semiconductor element is in strong demand.

SUMMARY OF THE INVENTION

The present invention was carried out to solve these problems. That is, an object of the present invention is to provide a semiconductor package which is thin, compact and highly reliable. Further, another object of the present invention is to provide a thin semiconductor package of high connection reliability. Still another object of the present invention is to provide a semiconductor package of a structure suitable for high density packaging.

In order to solve such problems, a semiconductor package of the present invention adopts such a configuration as described below.

The first aspect of a semiconductor package of the present invention Comprises, a wiring substrate having a first face and a second face, the first face having a first area and a second area surrounds the first area, and at least a first connecting pad arranged in the first area; a semiconductor element having a first face and a second face, the semiconductor element having at least a connecting terminal formed on the first face, and the semiconductor element being mounted on the first area of the wiring substrate in a face-down type; at least a conductive bump connecting the first connecting pad of the wiring substrate and the connecting terminal of the semiconductor element; and, a resin layer disposed on the first face of the wiring substrate, the resin layer disposed so that the second face of the semiconductor element being exposed, side faces of the semiconductor element being sealed, and a gap between the first face of the wiring substrate and the first face of the semiconductor element being filled.

It is also possible to comprises a wiring substrate which has a first face having a first area thereon a first connecting pads are disposed and a second area in the circumference of the first area and a second face; a semiconductor element which has a first face thereon connecting terminals are disposed and a second face, and is mounted in a face-down way on the first area of the first face of the wiring substrate; conductive bumps connecting the first connecting pads of the wiring substrate and connecting terminals of the semiconductor element; and a resin layer for sealing disposed such that the second face of the semiconductor element is exposed, and side surface of the semiconductor element is covered, and the resin layer fills a gap between the semiconductor element and the wiring substrate.

In the semiconductor package of the present invention, the resin layer for sealing may have a first face substantially in parallel with the first face of the wiring substrate, in addition, may be disposed such that the first face of the resin layer for sealing and the second face of the semiconductor element are substantially in a same plane.

In addition, the resin layer for sealing may be inclined in its side faces, and, at the same time, the first face of the wiring substrate can be made larger than the first face of the resin layer for sealing.

Further, the resin layer for sealing may be disposed so that it covers substantially the second area of the first face of the wiring substrate.

The semiconductor package of the present invention may further comprise a conductive plate on the second face of the semiconductor element. By disposing such a configuration, a heat releasing path of the semiconductor element can be secured. Therefore, reliability of the semiconductor package can be improved. Further, thermal load being put on the semiconductor package can be alleviated. Therefore, the stress generated due to discrepancy and the like of thermal expansion coefficients of the constituent elements such as a semiconductor element, a resin layer for sealing and a wiring substrate on the semiconductor package, can be alleviated. Therefore, a thin semiconductor package of high dimensional accuracy can be provided.

It is desirable to connect the conductive plate and the second face of the semiconductor element with a conductive resin. Since the conductive resin is high in its thermal conductivity, the heat of the semiconductor element can be effectively released outsides.

Further, the resin layer for sealing may be disposed such that it covers the side faces of the conductive plate. That is, with the resin layer for sealing, the conductive plate may be fixed. In this case, it is desirable from the view-point of securing heat releasing path to dispose the sealing resin layer with the conductive plate exposed.

Incidentally, the second face of the semiconductor element may be disposed with not only the conductive plate but also a heat releasing plate with a heat-sink, for instance.

The second aspect of a semiconductor package of the present invention comprises, a wiring substrate having a first face and a second face, the substrate having at least a first connecting pad formed on the first face; a semiconductor element having a first face and a second face, the semiconductor element having at least a connecting terminal formed on the first face, and the semiconductor element being mounted on the first area of the wiring substrate in a face-down type; at least a conductive bump connecting the first connecting pad of the wiring substrate and the connecting terminal of the semiconductor element; and, a resin layer disposed on the first face of the wiring substrate and the second face of the semiconductor element so that the semiconductor element being sealed; wherein, $(\alpha r \cdot Er \cdot Hr)/(\alpha s \cdot Es \cdot Hs)$ is approximately 0.6 or more, when $\alpha r$ is a thermal expansion coefficient of the resin layer, Er is a Young's modulus if the resin layer, Hr is a thickness of the resin layer, $\alpha s$ is a thermal expansion coefficient of the wiring substrates, Es is a Young's modulus of the wiring substrate and Hs is a thickness of the wiring substrates.

It is also possible to comprise a wiring substrate having a first face thereon a first connecting pads are disposed and a second face; a semiconductor element which has a first face thereon connecting terminals are disposed and a second face, and is mounted in a face-down way on the first face of the wiring substrate; conductive bumps connecting the first connecting pads of the wiring substrate and the connecting terminals of the semiconductor element; and a resin layer disposed on the first face of the wiring substrate in such a manner that seals the semiconductor element; wherein, when thermal expansion coefficient, Young's modulus and thickness of the wiring substrate is $\alpha s$, Es and Hs, respectively, and thermal expansion coefficient, Young's modulus and thickness of the resin layer is $\alpha r$, Er and Hr, respectively, $(\alpha r \cdot Er \cdot Hr)/(\alpha s \cdot Es \cdot Hs)$ is approximately 0.6 or more.

When thermal expansion coefficient and Young's modulus of the semiconductor is $\alpha c$, Ec, respectively, $(\alpha c \cdot Ec)/(\alpha s \cdot Es)$ may be designed to be approximately 1.5 or more.

The present inventors found that, by adjusting thermal expansion coefficient αs, Young's modulus Es and thickness Hs of the wiring substrate, and, thermal expansion coefficient αr, Young's modulus Er and thickness Hr of the resin layer, the stress being put on the semiconductor package can be effectively alleviated. The present invention is based on such findings.

That is, when thermal expansion coefficient, Young's modulus and thickness of the wiring substrate are αs, Es and Hs, respectively, and thermal expansion coefficient, Young's modulus and thickness of the resin layer are αr, Er and Hr, respectively, by setting respective parameters for the value of (αr·Er·Hr)/(αs·Es·Hs) to be approximately 0.6 or more, a semiconductor package of small deformation and high coplanarity can be obtained. Further, reliability during packaging a semiconductor package of the present invention on a mother substrate can be enhanced.

Incidentally, the thickness of a resin layer (under-fill) filled in between a semiconductor element and a wiring substrate is ordinarily extremely thin (for instance, approximately 0.2 mm or less). Therefore, this part exerts very slight influence on the distortion of the whole semiconductor package. Therefore, the thickness Hr of the resin layer is set as a thickness of the resin layer disposed on the second face of the semiconductor element. Further, the resin layer disposed as the under-fill and the resin layer sealing the whole semiconductor element can be composed of different materials.

For instance, the resin layer for sealing may be divided into a first portion filled in between the wiring substrate and the semiconductor element and a second portion covering the semiconductor element from above the second face of the semiconductor element, and the first portion may be constituted of a resin layer of smaller Young's modulus than that of the second portion. By adopting such a constitution, a soft resin can be disposed in the circumference of the conductive bumps, thereby deformation and rupture of the conductive bumps can be prevented from occurring. Therefore, a semiconductor package of high reliability and high productivity can be provided.

The third aspect of a manufacturing method of a semiconductor package of the present invention comprises, a step of mounting a semiconductor element on a first face of a wiring substrate, a first face of the semiconductor having at least a connecting terminal, the first face of the wiring substrate having at least a first connecting pad, the connecting terminal of the semiconductor element being connected by a conductive bump; and a step of forming a resin layer on the first face of the wiring substrate so that the semiconductor element is sealed; wherein, αr, Er, Hr, αs, Es, Hs are arranged so that (αr·Er·Hr)/(αs·Es·Hs) is approximately 0.6 or more, when αr is a thermal expansion coefficient of the resin layer, Er is a Young's modulus if the resin layer, Hr is a thickness of the resin layer, αs is a thermal expansion coefficient of the wiring substrates, Es is a Young's modulus of the wiring substrate and Hs is a thickness of the wiring substrates.

It is preferable to adjust αr, Er, or Hr of the resin so as to meet the equation.

The step of forming the resin layer can be carried out with transfer molding in which, after setting a wiring substrate mounted a semiconductor element thereon in a cavity, resin is supplied to be cured. Further, in this case, the resin layer may be supplied under pressure, and, at the same time, curing can be carried out thermally.

Further, with tablets of a resin of low melt viscosity such as epoxy based resin, the resin layer may be formed with transfer mold method.

The semiconductor package of the present invention may be provided with a sealing resin body consisting of a first resin layer filling a gap between a first face thereon conductive bumps of a semiconductor element are formed and a main surface of a wiring substrate, and a second resin layer which contacts at least circumference of a semiconductor element, and is formed so as to surround the semiconductor element.

A semiconductor package of the present invention comprises at least one semiconductor element having conductive bumps; a wiring substrate the main surface thereof is electrically connected to the semiconductor element through the conducive bumps; and a sealing resin formed on the main surface of the wiring substrate; wherein the sealing resin may be constituted of a first resin layer filling a gap between a first face thereon the conductive bumps of the semiconductor element are formed and the main surface of the wiring substrate, and a second resin layer contacting at least circumference of the semiconductor element and formed so as to surround the semiconductor element.

Further, according to the manufacturing method of the present invention, in a manufacturing method of the flip-chip type semiconductor package, to a gap between a wiring substrate accommodated in a cavity of a molding die and a semiconductor element connected thereon, and on exterior circumference thereof, a liquid resin is injected under pressure by a transfer method or an injection molding method, by curing this, the sealing resin is formed.

Incidentally, the present invention can be applied to various kinds of semiconductor packages and semiconductor devices. For instance, the semiconductor package of the present invention also includes an MCM(multi-chip module). In addition, as a semiconductor element to be mounted, a CPU, a DSP, various kinds of memory chips including a flash type non-volatile semiconductor memory, or a composite chip thereof can be cited.

BRIEF DESCRIPTION OF THE DRAWINGS

FIG. 7 is a chart showing results of coplanarity of a semiconductor package evaluated by simulation;

DESCRIPTION OF THE PREFERRED EMBODIMENT

Embodiment 1

Figure 1:
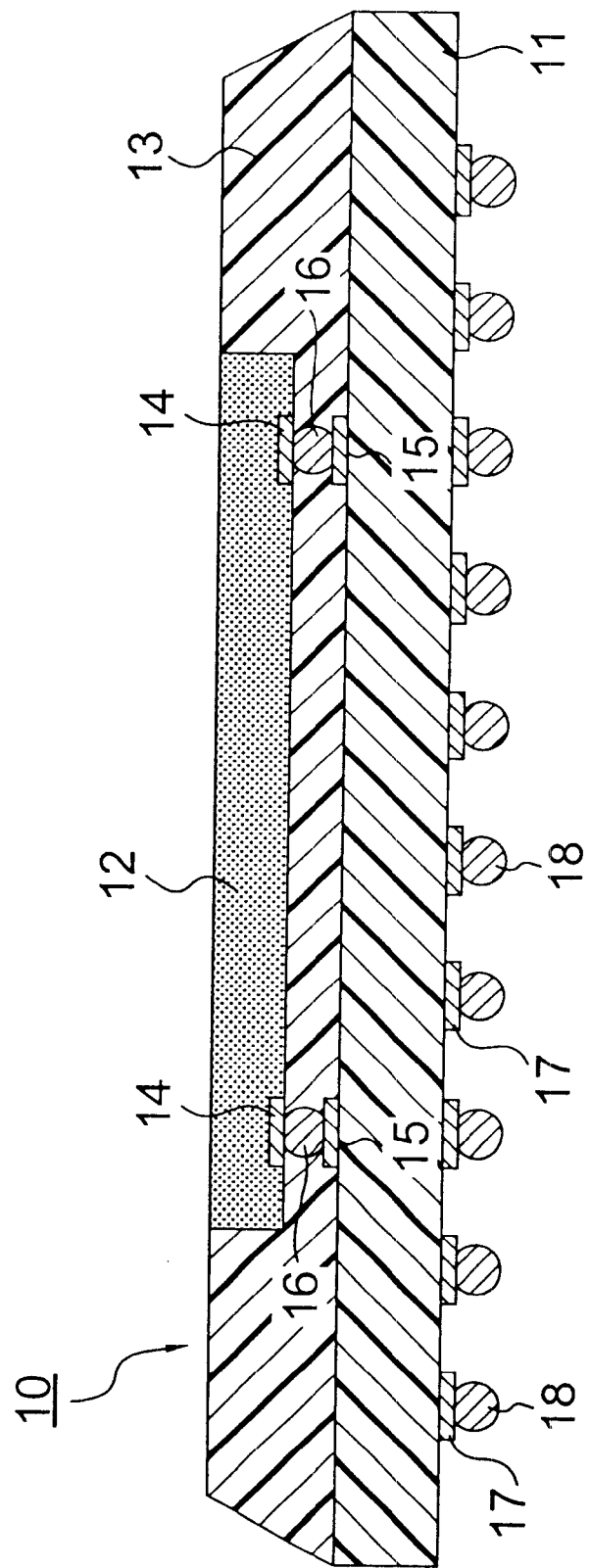
FIG. 1 is a diagram showing diagrammatically one example of a configuration of a semiconductor package of the present invention.

FIG. 1 is a diagram showing an example of a configuration of a semiconductor package of the present invention.

The semiconductor package 10 comprises a wiring substrate 11 having a wiring layer on a first face and another wiring layer on a second face, a semiconductor element 12 mounted on the first face of the wiring substrate 11, and a mold layer 13 which is disposed on the first face, where the semiconductor element being mounted on. The mold layer is consisting of a resin. This mold layer 13 is disposed such that a rear surface of a semiconductor element 12 is exposed.

The semiconductor element 12 is mounted in a face-down manner on a wiring substrate 11. That is, between connecting terminals 14 of the semiconductor element 12 and connecting pads 15 disposed as a part of wiring pattern of the wiring substrate, the conductive bumps 16 are disposed. The conductive bumps lo may be constituted of such as solder or gold, for instance. With the conductive bumps 16, the semiconductor element 12 and the wiring substrate 11 are connected electrically and mechanically.

On the other hand, on the second face of the wiring substrate 11, connecting terminals 17 are disposed, and on the connecting terminals 17, solder balls 18 are arranged in array. That is, the semiconductor package 10 is a semiconductor package of a BGA type. Incidentally, connecting terminals 15 and 17 of the wiring substrate 11 are connected through the interconnection such as through holes, conductive pillars and the like, for instance.

Here, in the wiring substrate 11, for instance, a glass cloth is used as a base material and therein organic material such as BT(Bis-maleimide Triazine) resin or epoxy resin is impregnated and is cured, the resultant cured resin polymer is adopted as an insulating layer. Further, the mold layer 13 is formed of epoxy based polymer, for instance.

Figure 14:
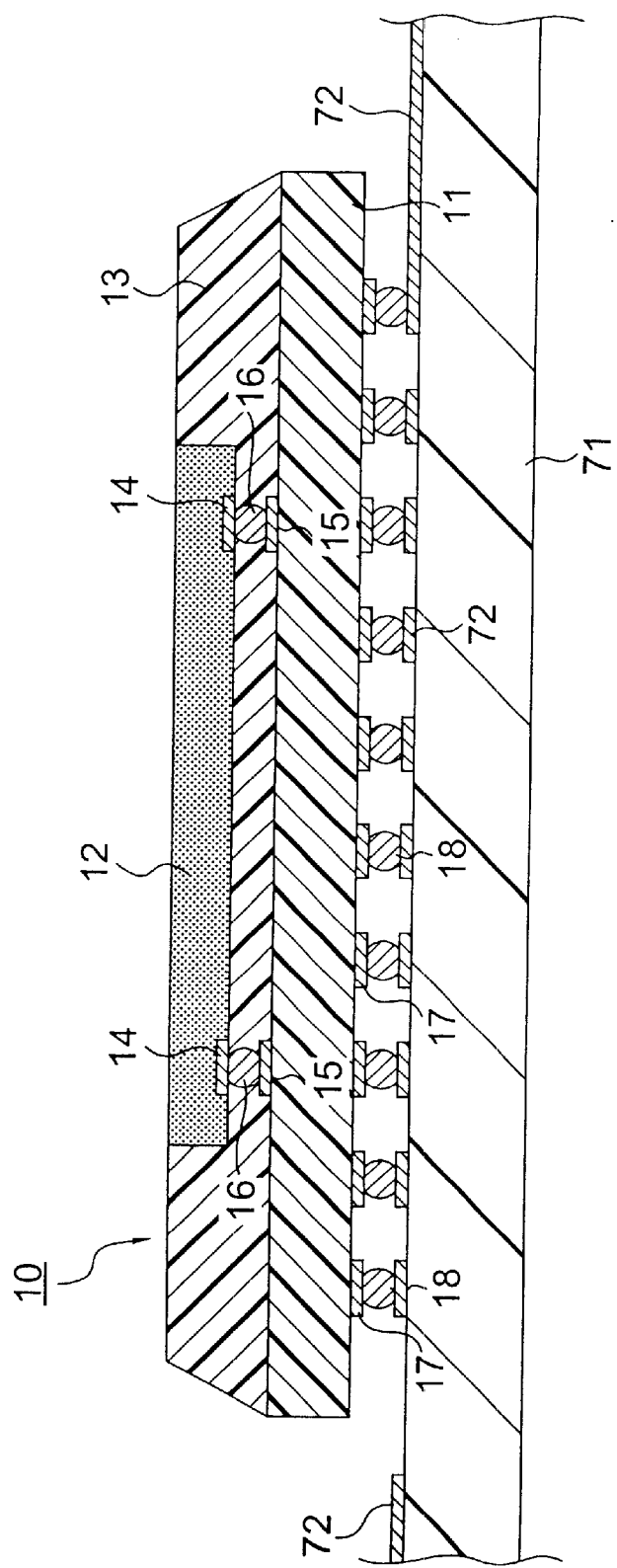
FIG. 14 is a diagram diagrammatically showing a structure of an electronic device having a mother wiring substrate the semiconductor package of the present invention being mounted.
Figure 15:
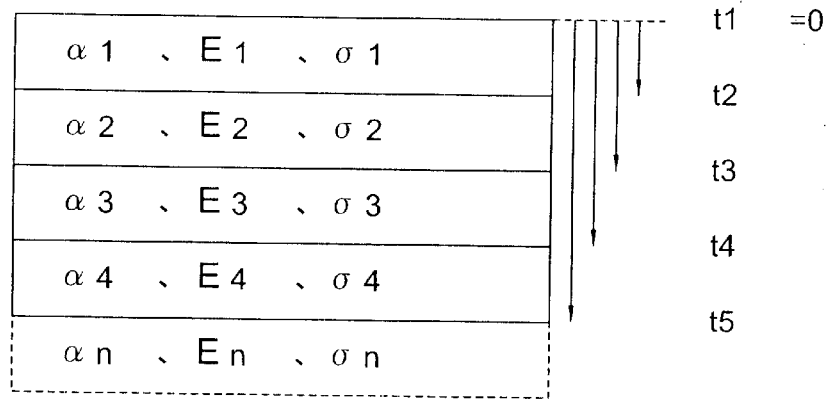
FIG. 15 is a diagram for explaining a warping of a multi-layered lamination.

FIG. 14 is a diagram diagrammatically showing a structure of an electronic device having a mother wiring substrate the semiconductor package of the present invention being mounted. The semiconductor package of the invention having a high coplanality, therefore, a reliability of the electronic device is promoted.

Figure 2:
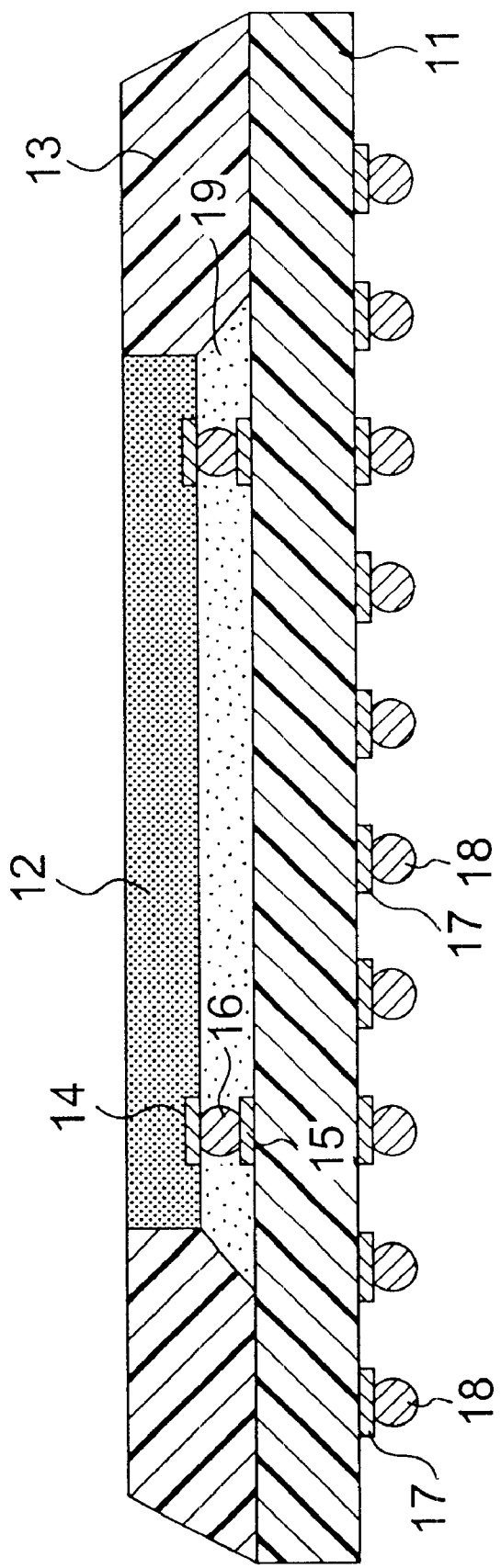
FIG. 2 is a diagram showing diagrammatically another example of a configuration of a semiconductor package of the present invention.

FIG. 2 is a diagram showing diagrammatically another example of a semiconductor package of the present invention.

In this semiconductor package, in a gap between a wiring substrate 11 and a semiconductor element 12, under-fill 19 consisting of a resin of a smaller Young's modulus than that constituting the mold layer 13 is filled.

By adopting such a configuration, a relatively soft resin can be disposed on the circumference of the conductive bumps 16. Thereby, the stress exerting on the conductive bumps 16 can be alleviated, accordingly reliability of connection between the wiring substrate 11 and the semiconductor element 12 can be promoted.

When a semiconductor package of the present invention is constituted with the aforementioned configuration, coplanality of the wiring substrate 11 was excellent. Therefore, upon mounting on a mother substrate, for instance, coplanarity of the connecting terminals 17 disposed in a ball grid array type was also excellent, accordingly connection of reliability could be enhanced.

Figure 3:
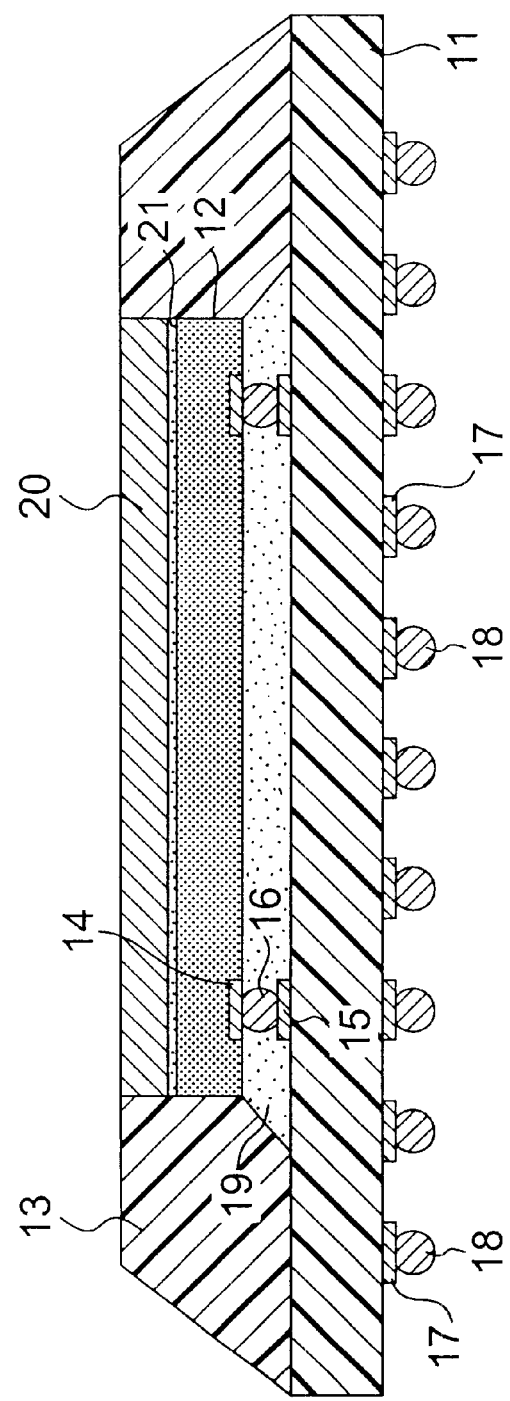
FIG. 3 is a diagram showing diagrammatically another example of a configuration of a semiconductor package of the present invention.

FIG. 3 is a diagram showing diagrammatically another example of a semiconductor package of the present invention. This semiconductor package is a modification example of the semiconductor packages illustrated in FIG. 1 and FIG. 2.

In this semiconductor package, a conductive plate 20 is disposed on a rear face of a main face of a semiconductor element 12. Main face is where an integrated circuit being formed. This conductive plate is composed of conductive materials consisting of Cu, 42 alloy, SUS, Ti, Fe, Ni and alloy materials mainly consisting thereof, for instance. This conductive plate 20 is adhered to the rear surface of the semiconductor element 12 with an adhesive layer 21 therein filler is dispersed. As an adhesive layer, one in which silver is dispersed as a filler is desirable, one in which silver is dispersed in high density is more desirable. For instance, SG-2105S(product of Ablestick Co,), DM4030HK(product of Diemat Co,) may be preferably employed. As a filler material being dispersed in a binder resin other than silver, aluminum hydroxide, alumina, silicon carbide, silica and the like can be cited, for instance.

By adopting such a configuration, a semiconductor package of the present invention can be made small in its deformation and extremely high in its flatness, at the same time, due to the conductive plate 20, heat due to operation of the semiconductor element 12 can be effectively dissipated. Therefore, a semiconductor package of high reliability can be provided. Further, extraneous electromagnetic noise such as EMI coming from outside the semiconductor package can be attenuated by the conductive plate 21. In this case, the conductive plate 21 can be provided with a means of securing ground potential.

Figure 4:
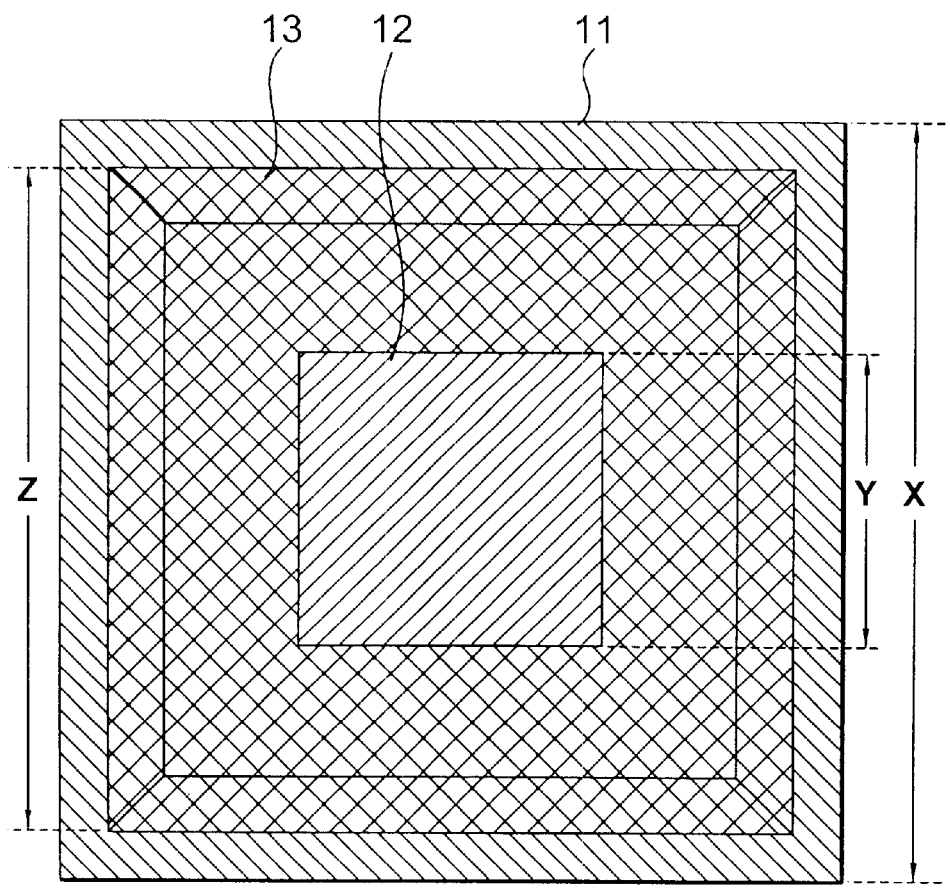
FIG. 4 is a diagram showing diagrammatically a plan configuration of the semiconductor package illustrated in FIG. 1.

FIG. 4 is a diagram showing diagrammatically a plan configuration of the semiconductor package illustrated in FIG. 1. The plane shapes of a wiring substrate 11, a semiconductor element 12 and a mold layer 13 are almost square. In this plan view, since an under-fill 19 is disposed underneath the semiconductor element 12, it is omitted in the figure.

The length x of one side of the wiring substrate 11 is either equal with the length z of one side of a lower surface of the package or longer than that. The thickness of the semiconductor element 12 is desirable to be 0.2 to 0.8 mm, that of the wiring substrate 11 is 0.3 to 10.0 mm, that of the first resin layer of the mold layer 13, that is, a spacing between the semiconductor element 12 and the wiring substrate 11, is 0.01 to 0.2 mm, respectively. The ratio of an area of the mold layer 13 to a packaging area of the wiring substrate is preferable to be 5 to 100%. Further, the thickness of the mold layer 13 is desirable to be 50 to 300% of that of the wiring substrate.

Figure 5:
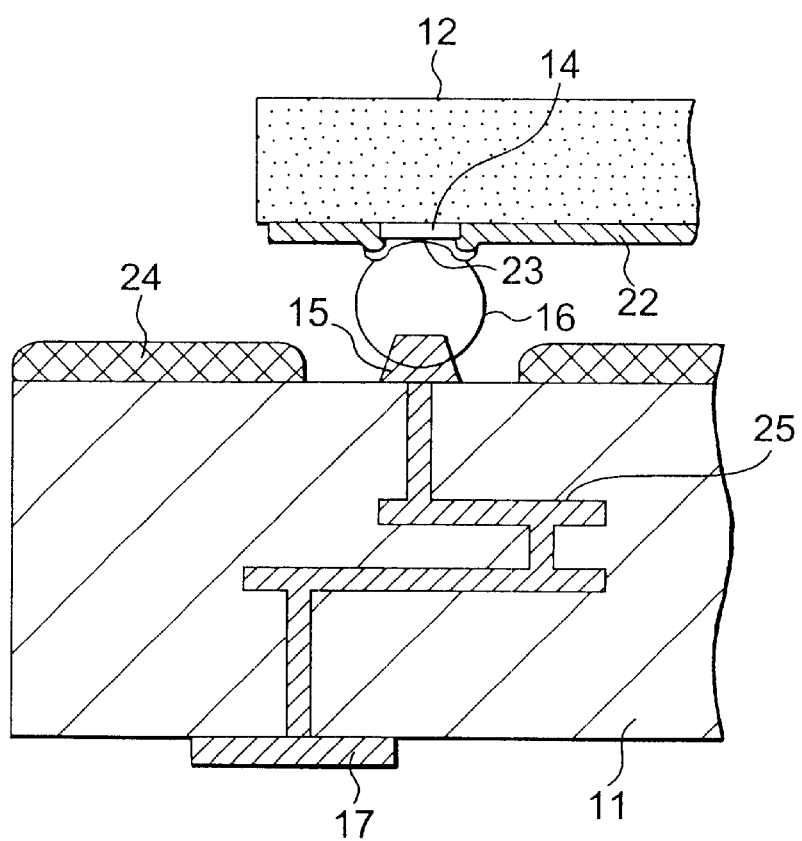
FIG. 5 is a diagram explaining a connection structure of a wiring substrate and a semiconductor element.

FIG. 5 is a diagram explaining a connection structure between a wiring substrate 11 and a semiconductor element 12.

The semiconductor element 12 is connected to the wiring substrate 11 through a conductive bump 16. On a surface of the semiconductor element 12 where an integrated circuit is formed, a connecting electrode 14 consisting of aluminum or the like is formed. Of the surface of the semiconductor element thereon an integrated circuit is formed, other region than that thereon the connecting electrode 14 is formed is covered and protected by a passivation film 22 such as oxide film and the like. On the surface of the connecting electrode 14, a plating film 23 of such as copper or the like is formed, and thereon, for instance, a conductive bump 16 consisting of Pb—Sn solder is connected. On the other hand, on the surface of the wiring substrate 11, a connecting pad 15 is formed, other than this is covered by a resist film 24. On the rear surface of the wiring substrate 11, a connecting electrode 17 is formed, the connecting electrode 17 is electrically connected to the connecting pad 15 through an interior wiring 25 of copper or the like formed inside the wiring substrate 11. The connecting electrode 17 can be provided with a conductive bump and a solder ball. With such a configuration, signals from the integrated circuit formed on the semiconductor element 12 or signals entering the integrated circuit are inputted/outputted to/from the exterior circuits.

Embodiment 2

Figure 6:
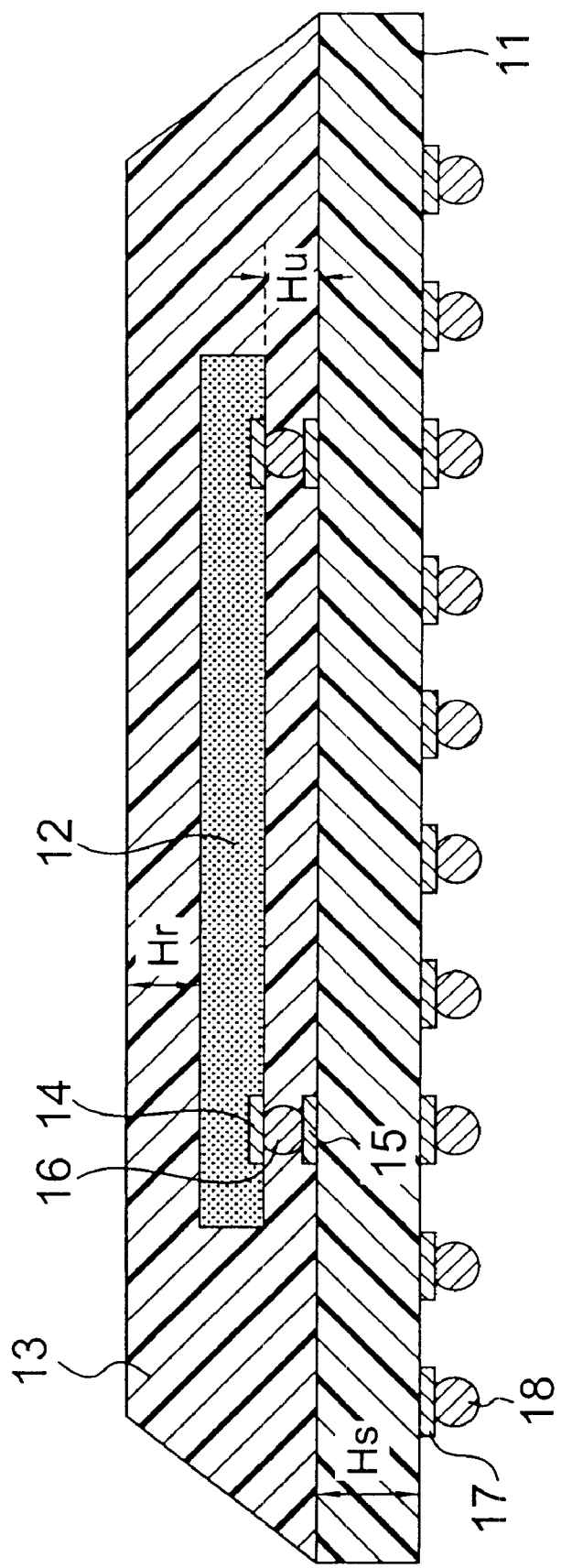
FIG. 6 is a diagram showing diagrammatically another example of a configuration of a semiconductor package of the present invention.

FIG. 6 is a diagram showing diagrammatically another example of a configuration of a semiconductor package of the present invention.

The principal structure of this semiconductor package is identical as that of the aforementioned one. However, this semiconductor package adopts a so-called over-coat structure, and a semiconductor element 12 is completely covered with a mold layer 13.

And, in this semiconductor package, when thermal expansion coefficient, Young's modulus and thickness of the wiring substrate are $\alpha s$, Es and Hs, respectively, and thermal expansion coefficient, Young's modulus and thickness of the resin layer are $\alpha r$, Er and Hr, respectively, the value R of $(\alpha r \cdot Er \cdot Hr)/(\alpha s \cdot Es \cdot Hs)$ is set to be approximately 0.6 or more. Further, when thermal expansion coefficient and Young's modulus of the semiconductor are $\alpha c$, Ec, respectively, $(\alpha c \cdot Ec)/(\alpha s \cdot Es)$ is set to be approximately 1.5 or more. By adopting such a configuration, the stress exerting on the semiconductor device such as a semiconductor package and the like can be effectively alleviated.

Incidentally, in general, among resin layers, the thickness Hu of the under-fill filled in between the semiconductor element and the wiring substrate is extremely thin (for instance, approximately 0.2 mm or less). Accordingly, influence on the strain of the semiconductor package as a whole due to this portion is very small. Therefore, the thickness Hr of the resin layer is set as a thickness of a resin layer disposed on the second face of the semiconductor element. Further, the resin layer disposed as the under-fill and the resin layer sealing the semiconductor element as a whole may be constituted of different materials.

In the semiconductor package illustrated in FIG. 6, the size of the semiconductor element 12 was set to 1 to 20 mm square, the thickness was set to 0.25 to 1.0 mm, the size of the wiring substrate 11 was set to 40 mm square, the thickness Hs was set to 0.2 to 1 mm, the coplarnarity of the semiconductor package was evaluated with these values through simulation. Incidentally, $(\alpha c \cdot Ec)/(\alpha s \cdot Es)$ was set approximately 1.6.

The type of a semiconductor package shown in FIG. 6 also can be mounted on a mother board(cf. FIG. 14).

FIG. 7 is a chart showing examples of results of this evaluation.

Smax denotes a limit of the size of a board in which displacement of the strain of a semiconductor package becomes smaller than 80 $\mu$m. From this table, it is recognized that, in the case of the value of R being smaller than approximately 0.6, the size of the board of less than 40 mm square is required to suppress too much displacement of the strain. In addition, in the case of the value of R being larger than approximately 0.6, it is recognized that, even if the size of the board is made more than 40 mm square, the displacement of the strain can be suppressed smaller than 80 $\mu$m. When an actual error during manufacturing is estimated as approximately 20 $\mu$m, according to the present invention, the displacement of the strain of the semiconductor package could be suppressed smaller than 100 $\mu$m.

Actual measurement of the displacement of the strain of the semiconductor package was carried out according to the measurement method of coplanality of the lowest surfaces of the terminals defined in EIAJ ED-7304.

Figure 8:
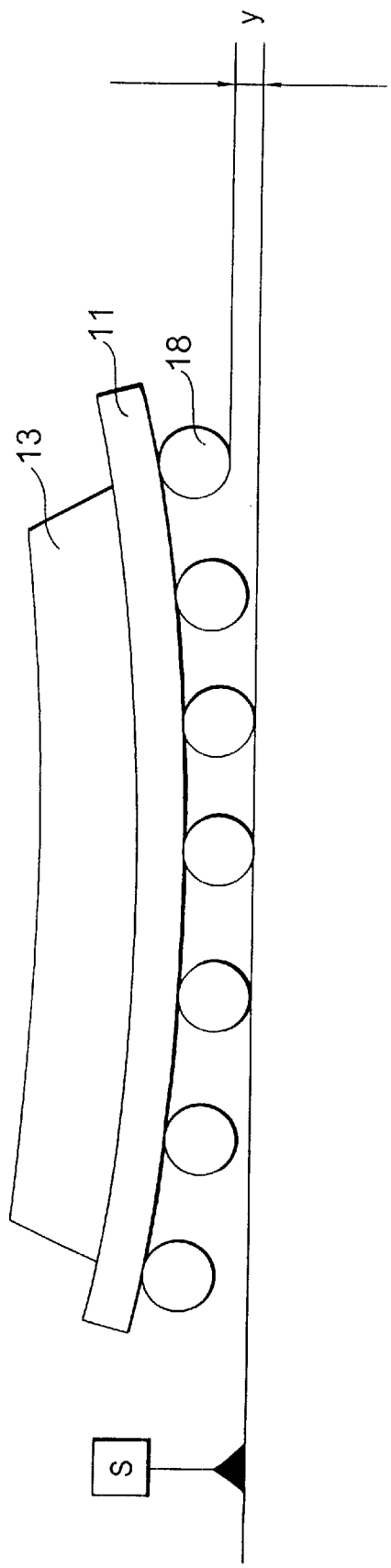
FIG. 8 is a diagram explaining coplanality of the most lowest surface of terminal.

FIG. 8 is a diagram explaining coplanality of the most lowest surface of the terminals. First, measure the distance from calculate datum S based on least square method(LSM) to the lowest point of every solder ball. Coplanality of the solder balls y to be the maximum value of the measured distance. In other word, datum S is calculated based on the least square surface of the connecting terminals 17 or the solder balls 18 disposed on the wiring substrate 11, the distance from this S to the most lowest point of each terminal is measured. Then, the maximum value of the measured values was made the coplanality y of the most lowest surface of the terminals.

As the result of the measurement, it is confirmed that, in the semiconductor package wherein the present invention is applied, the uniformity y of the most lowest surface of the terminals became less than 100 $\mu$m, thus the coplanarity was maintained high.

Thus, according to the semiconductor package of the present invention, a semiconductor package of small deformity and of high coplanarity can be obtained. Further, when the semiconductor package of the present invention is packaged in a mother board, reliability can be improved.

Embodiment 3

Here, a manufacturing method of a semiconductor package of the present invention will be outlined. Here, formation of molding resin due to transfer mold method will be described.

Figure 9A:
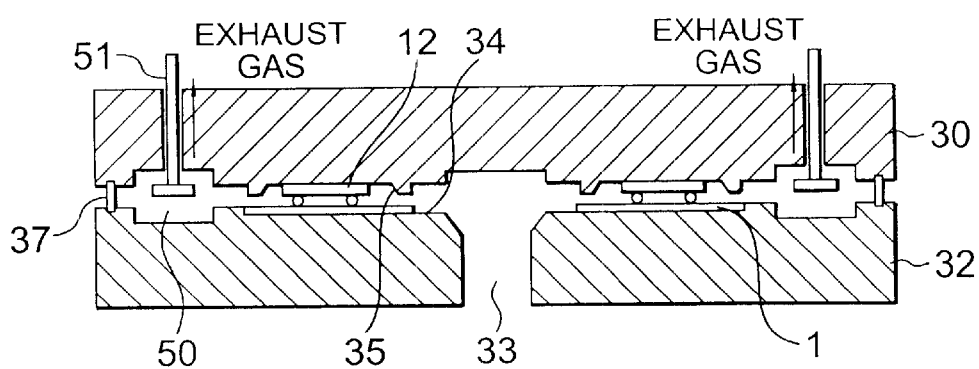
FIG. 9A and FIG. 9B are cross-sectional views of a molding die used for resin sealing for formation of a mold layer 13.
Figure 9B:
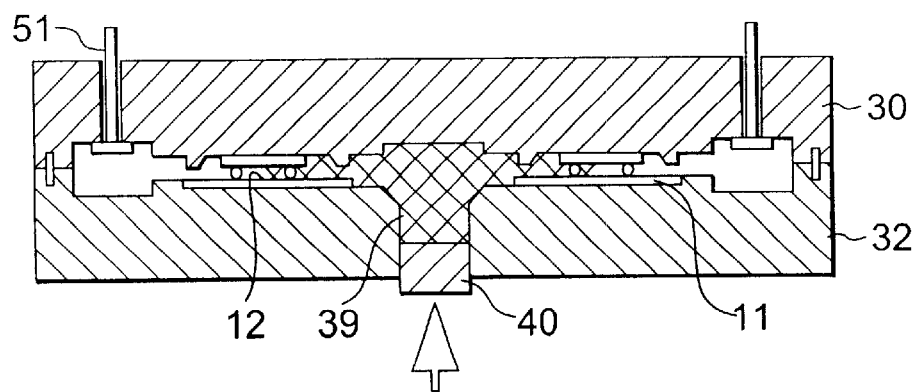

FIG. 9A and FIG. 9B are cross-sectional views of a molding die for resin sealing to be used for formation of a mold layer 13. In the molding die, an upper mold 30 and a lower mold 32 are sealed to form a cavity 38 accommodating the semiconductor element 12 and the wiring substrate 11 thereon the semiconductor element 12 is mounted. In the vicinity of the cavity 38, an exhausting groove is formed on the upper mold 30. Preceding the exhausting groove, a clearance 50 deeper than the exhausting groove is formed as a clearance for the preceding surface of the wiring substrate 11. In the exhausting groove, an exhausting valve 51 is disposed to seal the exhausting groove when a resin is injected into a cavity 38.

In the lower mold 32, a pot 33 accommodating tablets of an epoxy resin is formed. In the pot 33, a plunger 40 moves freely up and down therein. From the pot 33 to the cavity 38, a resin path of a runner 34 and a gate 35 are formed.

During molding, the semiconductor element 12 and the wiring substrate 1L are set in the lower mold 32 of the molding die (FIG. 9A). The tablets of the epoxy resin are supplied into the pot 33. The semiconductor element 12, being disposed in close vicinity of the interior surface of the upper mold, is not over-coated, a semiconductor package of the present invention shown in FIG. 1 is formed.

Here, resin materials are selected, when thermal expansion coefficient, Young's modulus and thickness of the wiring substrate 11 are αs, Es and Hs, respectively, and thermal expansion coefficient, Young's modulus and thickness of the resin layer 13 are αr, Er and Hr, respectively, for the value of (αr·Er·Hr)/(αs·Es·Hs) to be approximately 0.6 or more.

In order to obtain a cavity of a space of high vacuum, in the circumference of the molding die, a decompressing seal 37 of such as fluorinated rubber or the like is desirable to be disposed. In order to make short the access time for attaining high vacuum, the seal 37 is made to have a structure in which high vacuum can be obtained even in the case of being held only for several seconds with a gap of approximately 1 mm between the upper and the lower molds immediately before complete clamping.

The tablets of the resin 13i in the pot 33 are pressed by a plunger 40 to push up the exhausting valve 41, resulting in sealing of the exhausting groove.

In order to implementing molding, first, before complete clamping, the cavity 38 is made a high vacuum of less than 10 Torr. Then, the molding die is completely clamped.

The tablets of the resin 13i moves through the runner 34 to the cavity 33 from the gate 35. The tablets of the resin 13i is supplied an appropriate amount of resin in advance into the pot 33. In order to make the gap between the pot and the plunger as small as possible, on the exterior surface of the plunger, a ring of Teflon or the like equivalent to a sealing member can be formed to meet the exterior shape of the plunger to the interior diameter of the pot. The ring is exchangeable, and a structure capable of exchanging with speed upon occurrence of attrition or the like is desirable.

The gate 35, an inlet of a resin to be injected into the cavity 38, is disposed in a part of an exterior circumference of a flip-chip type semiconductor package, however, in the case of being formed on the side surface, for instance, the gate can be formed with a width of one side of the semiconductor element 12. Further, in order to prevent the resin from remaining on the wiring substrate 11 of the flip-chip type semiconductor package after molding, on the upper surface portion of the semiconductor element, a gate can be disposed.

The resin 13i is kept being pressurized under a pressure of approximately 1 to 20 MPa. The resin 13i is kept pressurized until being free of void, after the resin is filled in uniformly between the wiring substrate 11 and the semiconductor element 12, pressurizing is stopped.

Thereafter, the molding die is cooled, thereby the resin is cured to seal the semiconductor element 12 to be a resin sealed body, the mold layer 13 consisting thereof is eliminated of superfluous resin, thus a flip-chip type semiconductor package is formed.

According to this filling method of resin, in short time, the resin can be filled in uniformly between the wiring substrate 11 and the semiconductor element 12, and between the conductive bumps.

The mold layer 13 of the semiconductor package of the present invention is a convex type in its cross-sectional structure, and has a protruded structure at the edge portion. Therefore, warp of the package can be reduced, and reliability to thermal stress can be heightened.

Incidentally, here, as the resin used by the transfer molding, resins of low viscosity such as multi-functional epoxy resin and biphenyl type epoxy resin are used. Further, the particle diameter of the filler to be dispersed with the resin is suppressed at 45 μm or less when a gap between the wiring substrate 11 and the semiconductor element 12.

There are many cases where the thickness of the under-fill is 100 μm or less. In the case of C4 flip chip of being now popular, the gap between a wiring substrate and a semiconductor element is approximately 50 to 100 μm. When the particle diameter of the filler to be mixed with the resin is approximately 75 to 100 μm, the filler is clogged, accordingly can not be well filled in the gap between the wiring substrate and the semiconductor element. In addition, if the particle diameter of the filler is made small, viscosity of a mixture of the resin and the filler becomes large, again the gap between the wiring substrate and the semiconductor can not be filled. Therefore, the thickness of the resin layer formed by transfer molding method is at least approximately 100 to 200 μm.

The inventors have solved such problems by employing a resin of low viscosity type resin among multi-functional epoxy resin and biphenyl type epoxy resin and, in addition to this, by suppressing the diameter of the filler smaller than a gap between the wiring substrate 11 and the semiconductor element 12. In this example, in a distribution of the diameter, there is a cut off around 45 μm so that the diameters of the filler being smaller than a gap between the wiring substrate and the semiconductor element. By employing a resin of low viscosity as a binder, even if the diameter of the filler is controlled smaller, viscosity of the mixture thereof can be prevented from increasing. Therefore, with the transfer molding method, even into the gap between the wiring substrate arid the semiconductor element, resin layer for sealing can be formed. Further, according to such a method, the under-fill can be integrally formed in a forming step of the resin layer for sealing of the other portion. Therefore, productivity of semiconductor packages can be remarkably improved.

In this example, tablets contains about 80% by weight of filler(silica). Further, it is confirmed that tablets contains 90% by weight of filler has identical effect. It is not desirable to use those tablets contain less than 70% by weight in view of a hygroscopic property.

Figure 10:
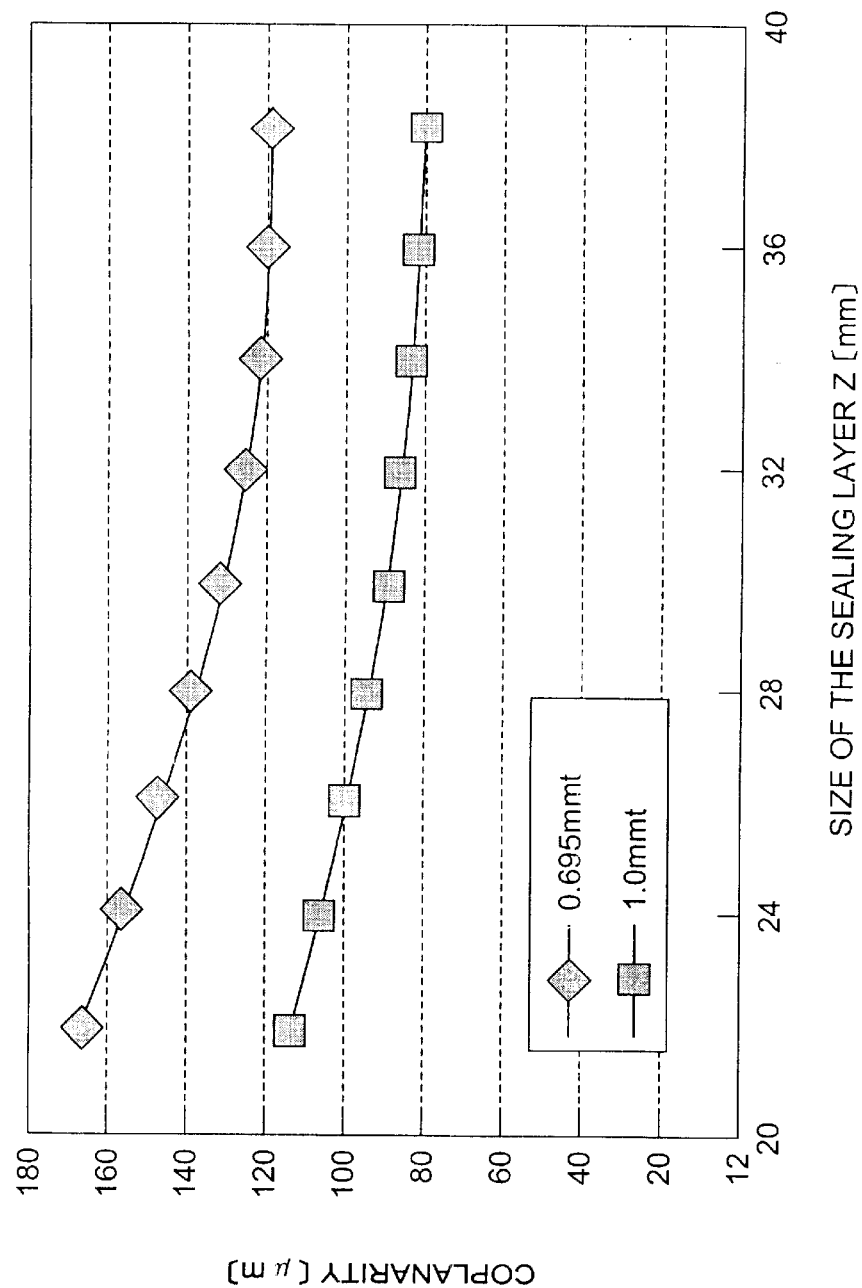
FIG. 10 is a diagram explaining dependence of relation between coplanality of the most lowest surface of the terminals of a semiconductor package and size of the mold layer on the thickness of the mold layer.
Figure 11:
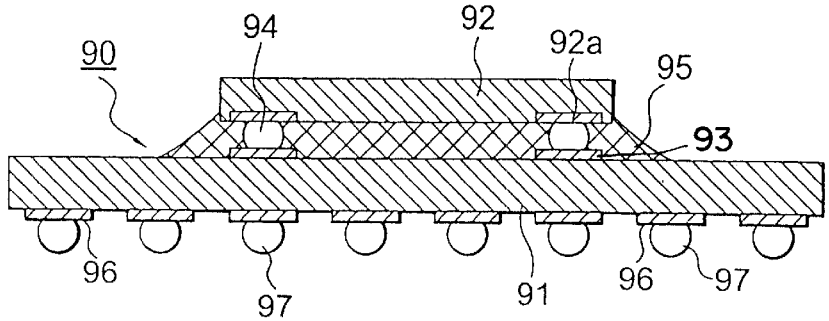
FIG. 11 is a diagram diagrammatically showing a structure of a conventional semiconductor package.
Figure 12A:
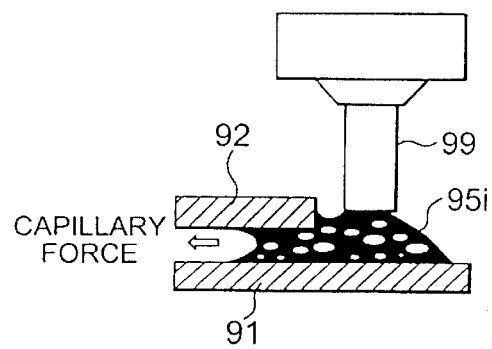
FIG. 12A, FIG. 12B and FIG. 12C are diagrams explaining a method of forming a resin layer 95 (under-fill)
Figure 12B:
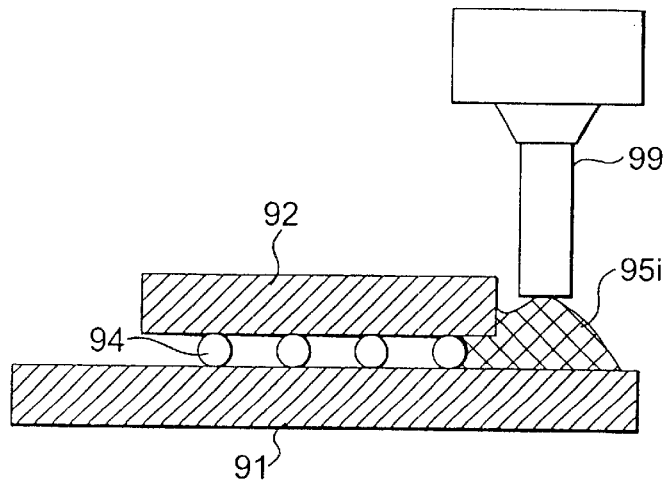
Figure 12C:
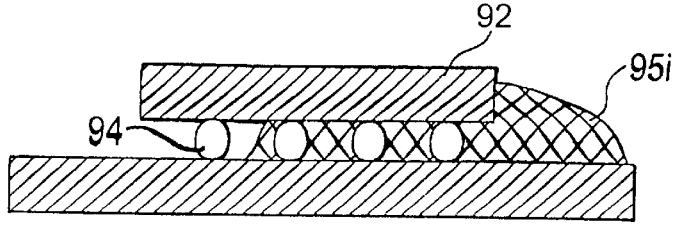
Figure 13A:
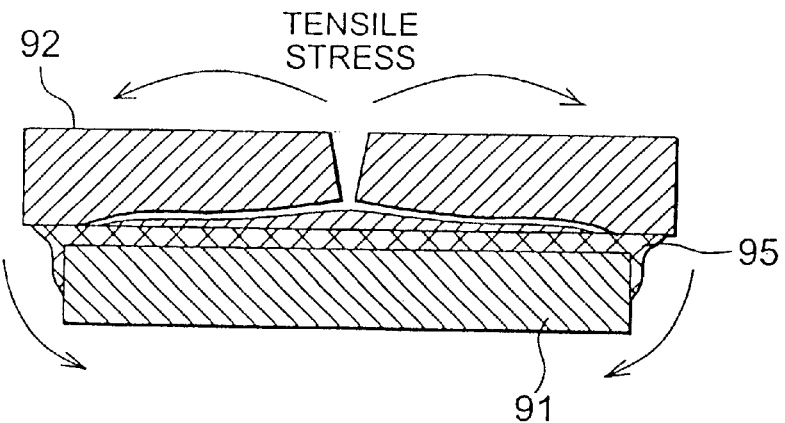
FIG. 13A, FIG. 13B and FIG. 13C are diagrams explaining stress exerted on a semiconductor package.
Figure 13B:
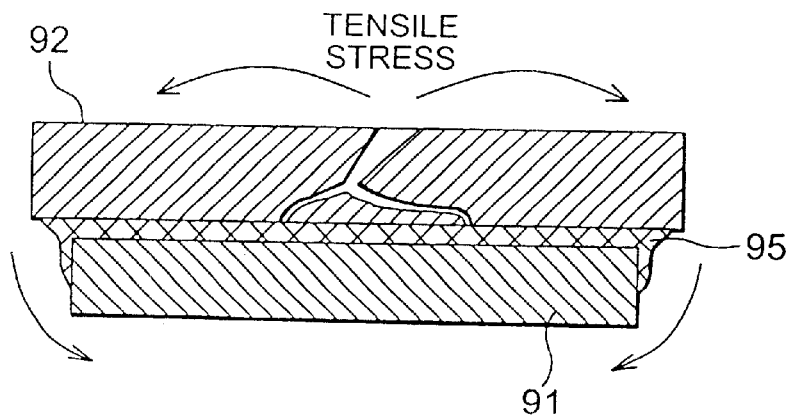
Figure 13C:
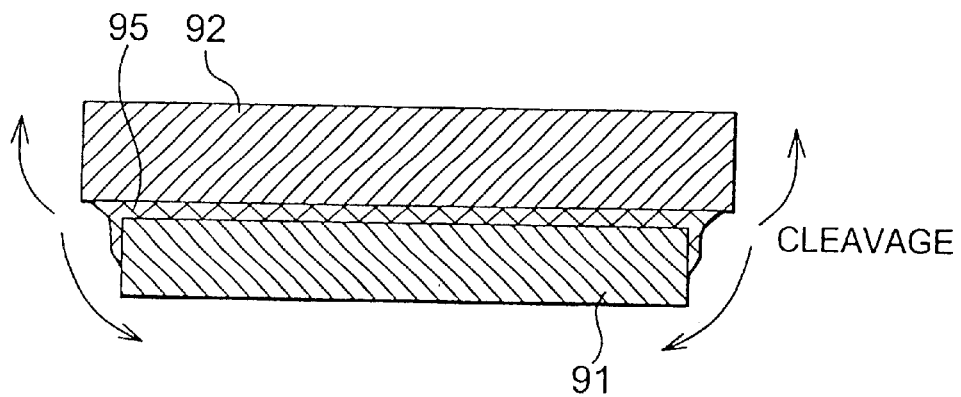

FIG. 10 is a diagram explaining dependence of relation between coplanality of the most lowest surface of terminals of a semiconductor package and size of the mold layer on the thickness of the mold layer.

Figure 16:
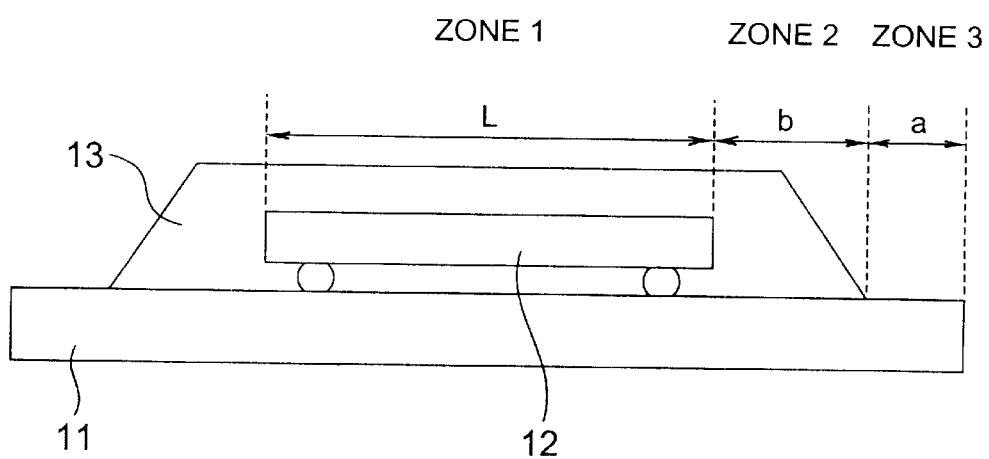
FIG. 16 and FIG. 17 are diagrams for explaining coplanarity of a semiconductor package of the present invention.
Figure 17:
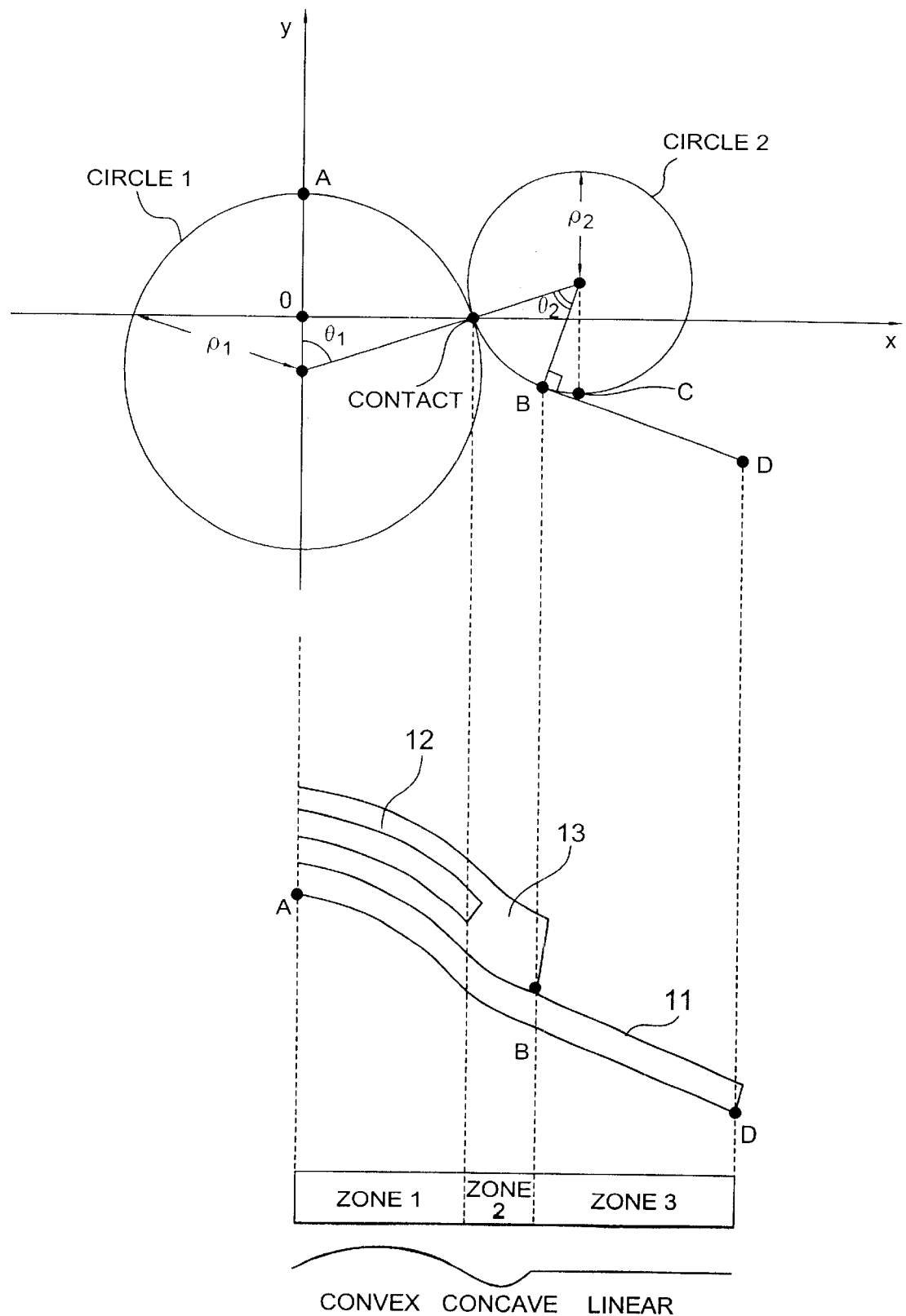

FIG. 16 and FIG. 17 are diagrams for explaining coplanarity of a semiconductor package of the present invention.

The degree of flexure of a semiconductor package is different each other in zone 1, zone 2, and zone 3 (FIG. 17). The shape of cross-section of a semiconductor package is a convex above arc in zone 1, a convex below arc in zone 2, and is a straight line in zone 3.

ρi is a radius of curvature of zone i.

Further, x axis is situated so as to go through a contact point of 2 circles, and y axis is situated so as to go through a center of a circle 1.

Point A is one that the circle 1 intersects with the y axis. Y coordinate of the point A corresponds to the coplanarity of the zone 1. This point corresponds to a center of the bottom surface (a surface of the side opposite to the surface where a semiconductor element 12 is mounted) of the wiring substrate 11.

Point B corresponds to a boundary of zone 2 and zone 3, and is a point shifted by the length of zone 2 along the circumference of the circle 2 from the contact point of 2 circles. Further, the point B corresponds to an exterior edge of a portion where a resin layer 13 is formed on the wiring substrate 11.

The point C is the point where y coordinate of the circle 2 shows the minimum value.

Point D is a point shifted by a length of zone 3 along a tangent line at the point B of the circle 2 and corresponds to an edge portion of the wiring substrate 11.

When $\rho_1$ is radius of curvature of the zone 1 and $\rho_2$ is radius of curvature of the zone 2, yi can be obtained as follows.

$$y_1 = \rho_1 - \rho_1 \cos\theta_1$$

$$Y_2 = \rho_2 \cos(\theta_2-\theta_1/2) - \rho_2 \cos\theta_1/2(\theta_2 > \theta_1/2) \text{ or } -\rho_2 \cos(-\theta_2+\theta_1/2) + \rho_2 \cos\theta_1/2(\theta_2 \leq \theta_1/2)$$

$$y_3 = \rho_2 \cos\theta_1/2 - \rho_2$$

$$y_4 = y_3 - a \times \sin(\theta_1/2 - \theta_2/2)$$

Here, $$\theta_1 = L/2\rho_1 \text{ and } \theta_2 = b/2\rho_2.$$

Thus, $y_1$, $Y_2$, $Y_3$, and $y_4$ are obtained. And, by extracting arbitrary 2 points of yi, the maximum value of their difference is made the coplanarity.

Incidentally, in this example, the point D is taken at the edge portion of the wiring substrate 11, however, it can be taken as the lowest point of a ball 18 disposed at the most exterior portion.

Here, as an insulating layer of the wiring substrate 11, a thermosetting type epoxy resin of thermal expansion coefficient of 20 to 40 ppm/K and of elasticity modulus of 2 to 13 GPa is adopted. The thickness of the wiring substrate 11 was set 0.4 to 1.2 mm. A semiconductor package in which a semiconductor element 12 of which the thickness is 0.25 to 0.75 mm was mounted on a wiring substrate 11 will be described. The length of one Side (y) of the semiconductor element 12 is 20 mm, and the length of one side (x) of the wiring substrate 11 is 40 mm.

In this case, the connecting terminals 17 and the solder balls 18 are arranged on the wiring substrate in a full grid of a matrix array. However, it is possible not to form the connecting terminals 17 and the solder balls 18 at a part of the matrix array.

The vertical coordinate of FIG. 10 denotes warp of the package, that is, coplanality y (mm) of the most lowest surface of the terminals, and the horizontal coordinate denotes the size of the mold layer (z) (mm). By varying the thickness of the mold layer Hr 0.695 mm and 1 mm, relation between the size of the wiring substrate of the semiconductor package and the coplanality y (mm) of the most lowest surface of the terminals is simulated.

As can be recognized from FIG. 10, the warp of the package decreases as the thickness of the mold layer increases, resulting in higher coplanality of the most lowest surface of the terminals. Further, with the increase of the package size (z), the warp of the package becomes small.

Further, as materials of the resin layer, thermosetting resin such as silicone resin, vinyl polymerization resin, phenolic resin, unsaturated polyester resin, diallyl phthalate resin, cyanate ester and acrylic resin can be employed.

Further, as materials of resin layer, and also an insulator of the wiring substrate super engineering plastic such as PPS or the like can be employed. Other than the ordinary epoxy resin, even in the case of use of above described resin, the present invention was confirmed to be effective.

What is claimed is:

1. A semiconductor device, comprising:
   a wiring substrate having a first face and a second face, the first face having a first area and a second area surrounds the first area, and at least a first connecting pad arranged in the first area;
   a semiconductor chip having a first face and a second face, the semiconductor chip having at least a connecting terminal formed on the first face, and the semiconductor chip being mounted on the first area of the wiring substrate in a face-down type;
   at least a conductive bump connecting the first connecting pad of the wiring substrate and the connecting terminal of the semiconductor chip; and
   a sealing resin layer having a first face substantially in parallel with the first face of the wiring substrate and disposed on the first face of the wiring substrate so that the second face of the semiconductor chip being exposed, side faces of the semiconductor chip being sealed, and a gap between the first face of the wiring substrate and the first face of the semiconductor chip being filled;
   wherein the first face of the wiring substrate is completely covered with the resin layer and a size of the first face of the resin layer is different from that of the first face of the wiring substrate, the thickness of the resin layer is in the range of 50 to 100% of that of the wiring substrate, the resin layer has a first portion filled in between the wiring substrate and the semiconductor element, and a second portion covering the semiconductor chip from above the second face of the semiconductor chip, and wherein a Young's modulus of the resin of the first portion is smaller than that of the resin of the second portion.

2. The semiconductor device as set forth in claim 1, wherein the first face of the sealing resin layer is substantially flushed with the second face of the semiconductor chip.

3. The semiconductor device as set forth in claim 1, wherein side faces of the resin layer for sealing is inclined, and the first face of the wiring substrate is larger than the first face of the resin layer.

4. A semiconductor device, comprising:
   a wiring substrate having a first face and a second face, the substrate having at least a first connecting pad formed on the first face;
   a semiconductor chip having a first face and a second face, the semiconductor chip having at least a connecting terminal formed on the first face, and the semiconductor chip being mounted on a first area of the wiring substrate in a face-down type;
   at least a conductive bump connecting the first connecting pad of the wiring substrate and the connecting terminal of the semiconductor chip; and
   a resin layer disposed on the first face of the wiring substrate so that the semiconductor chip is sealed;
   wherein, $(\alpha r \cdot Er \cdot Hr)/(\alpha s \cdot Es \cdot Hs)$ is approximately 0.6 or more, where $\alpha r$ is a thermal expansion coefficient of the resin layer, Er is a Young's modulus of the resin layer, Hr is a thickness of the resin layer, $\alpha s$ is a thermal expansion coefficient of the wiring substrate, Es is a Young's modulus of the wiring substrate, and Hs is a thickness of the wiring substrate.

5. The semiconductor device as set forth in claim 4, wherein, $(\alpha c \cdot Ec)/(\alpha s \cdot Es)$ is approximately 1.5 or more, when $\alpha c$ is a thermal expansion coefficient of the semiconductor chip and Ec is a Young's modulus of the semiconductor chip.

6. The semiconductor device as set forth in claim 4, wherein the resin layer for sealing has a first portion filled in between the wiring substrate and the semiconductor chip, and a second portion covering the semiconductor chip from above the second face of the semiconductor chip, and wherein the first portion and the second portion are formed of an identical resin.

7. The semiconductor device as set forth in claim 4, wherein the resin layer has a first portion filled in between the wiring substrate and the semiconductor chip, and a second portion covering the semiconductor chip from above the second face of the semiconductor chip, and wherein the resin forming the first portion and the second portion containing a filler having a distribution of a diameter less than a gap between the wiring substrate and the semiconductor chip.

8. A semiconductor device, comprising:

a wiring substrate having a first face and a second face, the first face having a first area and a second area surrounding the first area, and at least a first connecting pad arranged in the first area;

a semiconductor chip having a first face and a second face, the semiconductor chip having at least a connecting terminal formed on the first face, and the semiconductor chip being mounted on the first area of the wiring substrate in a face-down type;

at least a conductive bump connecting the first connecting pad of the wiring substrate and the connecting terminal of the semiconductor chip; and a sealing resin layer having a first face substantially in parallel with thw first face of the wiring substrate and disposed on the first face of the wiring substrate so that the second face of the semiconductor chip being exposed, side faces of the semiconductor chip being sealed, and a gap between the first face of the wiring substrate and the first face of the semiconductor chip being filled;

wherein the first face of the wiring substrate is completely covered with the resin layer and a size of the first face of the resin layer is different from that of the first face of the wiring substrate, wherein the thickness of the resin layer is in a range of 50 to 100% of that of the wiring substrate, wherein the resin layer has a first portion filled in between the wiring substrate and the semiconductor chip and a second portion covering the semiconductor chip from above the second face of the semiconductor chip, the first portion including a first resin and the second portion including a second resin different from the first resin, and whereing a Young's modulus of the first resin is smaller than that of the second resin.

9. The semiconductor device as set forth in claim 1, wherein the wiring substrate is a resin impregnated glass cloth substrate.

10. The semiconductor device as set forth in claim 1, wherein the second face of the wiring substrate has second connecting pads on which solder balls are arranged in an array.

11. The semiconductor device as set forth in claim 4, wherein the wiring substrate is a resin impregnated glass substrate.

12. The semiconductor device as set forth in claim 4, wherein the second face of the wiring substrate has second connecting pads on which solder balls are arranged in an array.

13. The semiconductor device as set forth in claim 8, wherein the wiring substrate is a resin impregnated glass cloth substrate.

14. The semiconductor device as set forth in claim 8, wherein the second face of the wiring substrate has second connecting pads on which solder balls are arranged in an array.

15. The semiconductor device as set forth in claim 7, wherein the particle diameter of the filler is 45μm or less.

\* \* \* \* \*

UNITED STATES PATENT AND TRADEMARK OFFICE
CERTIFICATE OF CORRECTION

PATENT NO. : 6,448,665 B1
DATED : September 10, 2002
INVENTOR(S) : Nakazawa et al.

It is certified that error appears in the above-identified patent and that said Letters Patent is hereby corrected as shown below:

<u>Title page, Item [54] and Column 1, line 1,</u>
Change "PACKAGE" to -- DEVICE --.

<u>Column 16,</u>
Line 30, change "element," to -- chip, --.

<u>Column 17,</u>
Line 35, change "thw first" to -- the first --.

<u>Column 18,</u>
Line 15, change "whereing" to -- wherein --.

Signed and Sealed this

Eleventh Day of February, 2003

JAMES E. ROGAN
*Director of the United States Patent and Trademark Office*